US007663056B2

(12) United States Patent
Yonezawa et al.

(10) Patent No.: US 7,663,056 B2
(45) Date of Patent: Feb. 16, 2010

(54) CHALCOPYRITE TYPE SOLAR CELL

(75) Inventors: Satoshi Yonezawa, Utsunomiya (JP); Tadashi Hayashida, Saitama (JP)

(73) Assignee: Honda Motor Co., Ltd., Tokyo (JP)

( * ) Notice: Subject to any disclaimer, the term of this patent is extended or adjusted under 35 U.S.C. 154(b) by 384 days.

(21) Appl. No.: 10/599,896

(22) PCT Filed: Apr. 25, 2005

(86) PCT No.: PCT/JP2005/007783

§ 371 (c)(1),
(2), (4) Date: Oct. 12, 2006

(87) PCT Pub. No.: WO2005/106968

PCT Pub. Date: Nov. 10, 2005

(65) Prior Publication Data

US 2007/0209700 A1    Sep. 13, 2007

(30) Foreign Application Priority Data

Apr. 28, 2004    (JP) .............................. 2004-133292

(51) Int. Cl.
*H01L 31/00* (2006.01)
(52) U.S. Cl. ................. 136/262; 136/265; 136/256
(58) Field of Classification Search .................. None
See application file for complete search history.

(56) References Cited

U.S. PATENT DOCUMENTS 5,626,688 A    5/1997    Probst et al.
5,676,766 A *  10/1997   Probst et al. ............. 136/265
6,127,202 A    10/2000   Kapur et al.
6,274,805 B1    8/2001   Nakazawa et al.
2004/0144419 A1 * 7/2004 Fix et al. ................. 136/252

FOREIGN PATENT DOCUMENTS

| JP | 81403 | 4/1929 |
|---|---|---|
| JP | 58-061678 | 4/1983 |
| JP | 59-119877 | 7/1984 |
| JP | 59-119878 | 7/1984 |
| JP | 61-15763 | 1/1986 |
| JP | 05-259494 | 10/1993 |
| JP | 08-125206 | 5/1996 |
| JP | 8-222750 | 8/1996 |
| JP | 11-340482 | 12/1999 |
| JP | 2000-58893 | 2/2000 |
| JP | 2001-257374 | 9/2001 |
| JP | 2001-339081 | 12/2001 |
| JP | 2003-318424 | 11/2003 |
| WO | 98/50962 | 11/1998 |

* cited by examiner

*Primary Examiner*—Jennifer K Michener
*Assistant Examiner*—Miriam Berdichevsky
(74) *Attorney, Agent, or Firm*—Rankin, Hill & Clark LLP

(57) ABSTRACT

A chalcopyrite type solar cell has a mica aggregate substrate formed by binding mica particulates with a resin. A multi-layer body consisting of a first electrode, a light absorption layer and a second electrode is formed on the mica aggregate substrate with a smoothing layer and a binder layer interposed between the substrate and the body. The smoothing layer is preferably made of SiN or $SiO_2$, and the binder layer is made of TiN or TaN.

4 Claims, 5 Drawing Sheets

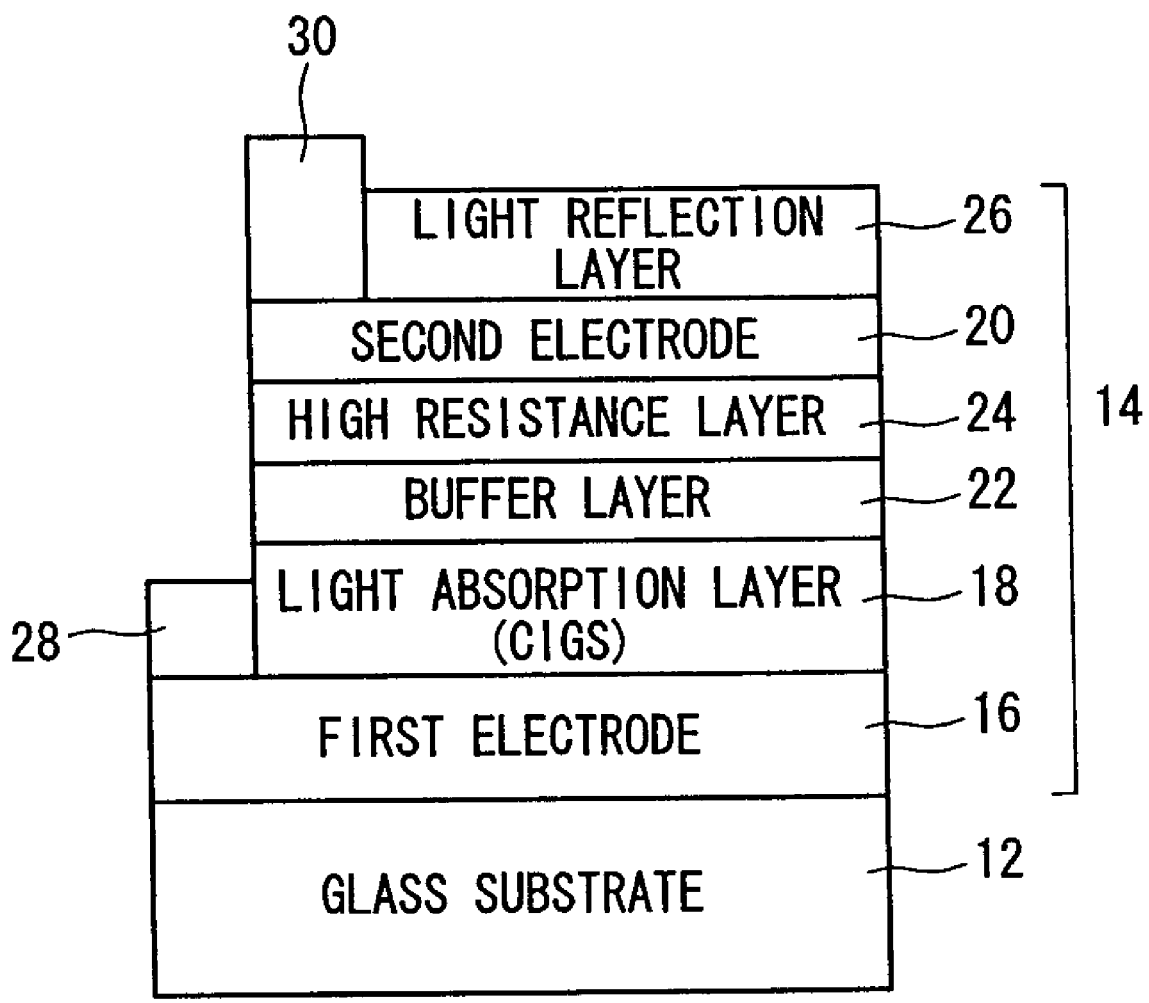

CHALCOPYRITE TYPE SOLAR CELL

TECHNICAL FIELD

The present invention relates to a chalcopyrite type solar cell having an insulative substrate containing mica.

BACKGROUND ART

A chalcopyrite type solar cell is a solar cell which includes, as a light absorption layer, a chalcopyrite compound represented by Cu(InGa)Se (hereinafter also referred to as "CIGS"). Special attention has been focused on this type of solar cell, since chalcopyrite type solar cells possess various advantages. For example, the energy conversion ratio of such solar cells is high, the optical deterioration due to aging is rarely caused, resistance to radiation is excellent, and the solar cell exhibits a wide light absorption wavelength range as well as a large light absorption coefficient. Thus, various investigations have been conducted in order to realize mass production of chalcopyrite type solar cells.

As shown in FIG. 5, a chalcopyrite type solar cell 10 of this type is provided by disposing a stack 14 on a glass substrate 12. The basic structure of the stack 14 includes a first electrode 16 composed of Mo, a light absorption layer 18 composed of CIGS, and a transparent second electrode 20 composed of ZnO/Al. However, in general, a buffer layer 22 and a high resistance layer (semi-insulative layer) 24 are also provided, which intervene between the light absorption layer 18 and the second electrode 20, in order to adjust a band gap with respect to the light absorption layer 18. Further, an antireflection layer 26 is provided on the second electrode 20 in order to prevent light that enters the light absorption layer 18 from reflecting and leaking to the outside. The buffer layer 22, the high resistance layer 24, and the antireflection layer 26 are composed of, for example, CdS, ZnO, and $MgF_2$ respectively. Further, ZnO or InS may be selected as the material for the buffer layer 22 in some cases. Either one of the buffer layer 22 or the high resistance layer 24 can be formed as a single layer.

A portion of the first electrode 16 is exposed from the stack 14, and a first lead section 28 is provided at the exposed portion. On the other hand, a portion of the second electrode 20 also is exposed from the antireflection layer 26, wherein a second lead section 30 is provided at the exposed portion.

When light, such as sunlight, is radiated onto the chalcopyrite type solar cell 10, which is constructed as described above, pairs of electrons and positive holes are generated within the light absorption layer 18. The electrons gather at the interface of the second electrode 20 (N-type side), whereas the positive holes gather at the interface of the light absorption layer 18 (P-type side), in relation to the joined interface between the CIGS light absorption layer 18 forming a P-type semiconductor, and the second electrode 20 forming an N-type semiconductor. When this phenomenon occurs, an electromotive force is generated between the light absorption layer 18 and the second electrode 20. Electrical energy brought about by the electromotive force is extracted externally as a current from the first lead section 28 and the second lead section 30, which are connected to the first electrode 16 and the second electrode 20 respectively.

Usually, the chalcopyrite type solar cell 10 shown in FIG. 5 is manufactured in the following manner. First, the first electrode 16 composed of Mo is formed as a film on a soda-lime glass substrate 12, for example, by means of sputtering film formation.

Subsequently, the first electrode 16 is divided by radiating a laser beam thereon, to perform a so-called "scribing" operation.

Cutting scraps, which occur during the dividing operation, are removed by washing with water. Thereafter, Cu, In, and Ga are caused to adhere onto the first electrode 16 by means of sputtering film formation, in order to provide a precursor. The precursor is placed in a heat treatment furnace, together with the substrate and the first electrode 16, to perform annealing in an $H_2Se$ gas atmosphere. The precursor is converted into selenide during the annealing process, thereby forming a light absorption layer 18 composed of CIGS.

Subsequently, the N-type buffer layer 22 composed of, for example, CdS, ZnO, or InS is provided on the light absorption layer 18. The buffer layer 22 is formed, for example, by means of sputtering film formation or chemical bath deposition (CBD).

Further, the high resistance layer 24 composed of, for example, ZnO is formed, for example, by means of sputtering film formation. Then, the high resistance layer 24, the buffer layer 22, and the light absorption layer 18 are subjected to scribing using a laser beam or a metal probe. As a result of scribing, the high resistance layer 24, the buffer layer 22, and the light absorption layer 18 are divided.

Subsequently, the second electrode 20 composed of ZnO/Al is provided by means of sputtering film formation. Then, the second electrode 20, the high resistance layer 24, the buffer layer 22, and the light absorption layer 18 are subjected to scribing using a laser beam or a metal probe.

Finally, the first lead section 28 and the second lead section 30 are provided at exposed portions of the first electrode 16 and the second electrode 20, respectively. Consequently, as a result of the aforementioned process, the chalcopyrite type solar cell 10 is obtained.

The chalcopyrite type solar cell 10, obtained as described above, forms one cell unit. Usually, a large-sized system having a panel-shaped form, in which a plurality of such cell units are electrically connected to one another, is used in practice.

As described above, glass is selected as the material for the substrate in most cases, since glass is easily available and inexpensive. In addition, since the glass surface itself is smooth, the surface of the film that is stacked on the substrate can also be made relatively smooth. Further, sodium contained in the glass diffuses toward the light absorption layer. As a result, energy conversion efficiency is increased.

However, when a glass substrate is used, and the precursor is subjected to selenide formation, high temperatures cannot be used. Therefore, it is difficult to advance selenide formation, so as to produce a composition in which the energy efficiency thereof is extremely large. Further, other inconveniences arise because the substrate is thick. Specifically, the feeding apparatus, which is used to feed the glass substrate when the chalcopyrite type solar cell is produced, must be large in size. Further, the produced chalcopyrite type solar cell has a large mass. Additionally, since the glass substrate is essentially non-flexible, it is difficult to adapt the aforementioned process to a "roll-to-roll process" mass production method.

As a countermeasure to overcome the above problems, materials for the substrate other than glass have been considered. For example, in Patent Document 1, a chalcopyrite type solar cell, in which a polymer film is used as a substrate, has been proposed. Additionally, in Patent Document 2, stainless steel has been proposed as a material for the substrate of a chalcopyrite type fuel cell. Patent Document 3 lists such materials as glass, alumina, mica, polyimide, molybdenum, tungsten, nickel, graphite, and stainless steel. Patent Document 2 also suggests providing a protective layer, composed of $SiO_2$ or $FeF_2$, in order to prevent the stainless steel substrate from being attacked by selenium during selenide formation.

Patent Document 1: Japanese Laid-Open Patent Publication No. 5-259494;

Patent Document 2: Japanese Laid-Open Patent Publication No. 2001-339081;

Patent Document 3: Japanese Laid-Open Patent Publication No. 2000-58893.

DISCLOSURE OF THE INVENTION

Problems to be Solved by the Invention

However, when a polymer film is used as the substrate, as described in Patent Document 1, although flexibility is imparted to the chalcopyrite type solar cell, a problem arises in that high temperatures cannot be applied during selenide formation. For example, in the case of polyimide, it is impossible to use temperatures of 260° C. or greater. Therefore, it is impossible to perform selenide formation using $H_2Se$ gas, which requires a temperature of not less than 500° C.

In Patent Document 2, the stainless steel substrate may not be sufficiently protected by the protective layer. That is, in certain situations, the stainless steel substrate becomes eroded during selenide formation, whereby the first electrode may become disengaged. Further, the protective layer may itself become disengaged, exposing the conductive stainless steel substrate. Therefore, an inconvenience arises in that scribing cannot be performed using a metal probe.

In Patent Document 3, various materials are listed as proposed materials for the substrate. However, all of the chalcopyrite type solar cells disclosed in Patent Document 3 are formed using glass substrates only. Therefore, it is not clear whether erosion can be avoided during selenide formation, even when other materials are used. For example, when a mica aggregate substrate, comprising mica particles bonded by a resin, is used as the substrate and provided within a stack, it is recognized that the stack tends easily to become disengaged from the mica aggregate substrate, and hence energy conversion efficiency is lowered.

A general object of the present invention is to provide a chalcopyrite type solar cell, which makes it possible to perform mass production thereof.

A principal object of the present invention is to provide a chalcopyrite type solar cell, in which energy conversion efficiency and an open circuit voltage thereof are large.

Another object of the present invention is to provide a chalcopyrite type solar cell, in which it is possible to avoid disengagement of the cell stack from a substrate.

According to one aspect of the present invention, a chalcopyrite type solar cell is provided, comprising a stack including a first electrode composed of a metal, a light absorption layer formed on the first electrode, which is composed of a chalcopyrite type compound serving as a P-type semiconductor, and a second electrode formed on the light absorption layer, which serves as an N-type semiconductor, wherein:

mica is contained in an insulative substrate that retains the stack; and a binder layer, which functions at least as a binder, is interposed between the insulative substrate and the stack.

Mica is excellent in flexibility. Therefore, for example, a substrate can be formed using a mica aggregate that is wound and fed thereon, as described later on, and wherein the mica aggregate is cut to have a predetermined size. In other words, the mica aggregate can be wound in the form of a roll. Therefore, a mass production method using a roll-to-roll process can easily be implemented. Hence, a mass production method for the chalcopyrite type solar cell can be realized.

Further, mica is inexpensive as compared with soda-lime glass. Therefore, production costs of the chalcopyrite type solar cell are inexpensive. Further, mica is light in weight. Therefore, it is also possible to decrease the mass of the chalcopyrite type solar cell.

Further, mica exhibits excellent heat resistance as compared with glass substrates. Therefore, selenide formation can be applied, at temperatures of about 600 to 700° C., while using $H_2Se$ gas, thereby enabling a precursor of Cu, In, Ga to adhere to the first electrode, in order to provide the light absorption layer. Selenide formation of the precursor can be reliably advanced under the conditions described above. Therefore, a chalcopyrite type solar cell having a large open circuit voltage (open voltage) can be constructed.

Further, since the binder layer is interposed between the mica substrate and the stack, a high joining strength between the mica substrate and the stack can be obtained. Therefore, the stack is prevented from disengaging from the mica substrate.

Due to the presence of the binder layer, any impurities contained in the mica substrate are prevented from being diffused toward the light absorption layer. Therefore, energy conversion efficiency of the chalcopyrite type solar cell can be improved.

Preferred materials for the binder layer include substances containing TiN or TaN. It is preferable for the binder layer to have a thickness of 0.5 to 1 μm.

On the other hand, preferred materials for the insulative substrate include a mica aggregate, which is sintered after mixing powdery granular mica with a resin.

It is preferable for a smoothing layer containing one of SiN to $SiO_2$ and having irregularities on an upper end surface thereof to be provided between the insulative substrate and the binder layer, wherein the irregularities of the smoothing layer are smaller than irregularities on an upper end surface of the insulative substrate. Accordingly, transfer of irregularities to the first electrode and the light absorption layer can be avoided. As a result, an advantage is obtained in that the open circuit voltage of the chalcopyrite type solar cell is increased.

BRIEF DESCRIPTION OF THE DRAWINGS

FIG. 5 is a schematic vertical sectional view illustrating a chalcopyrite type solar cell in accordance with a conventional technique.

BEST MODE FOR CARRYING OUT THE INVENTION

Figure 1:
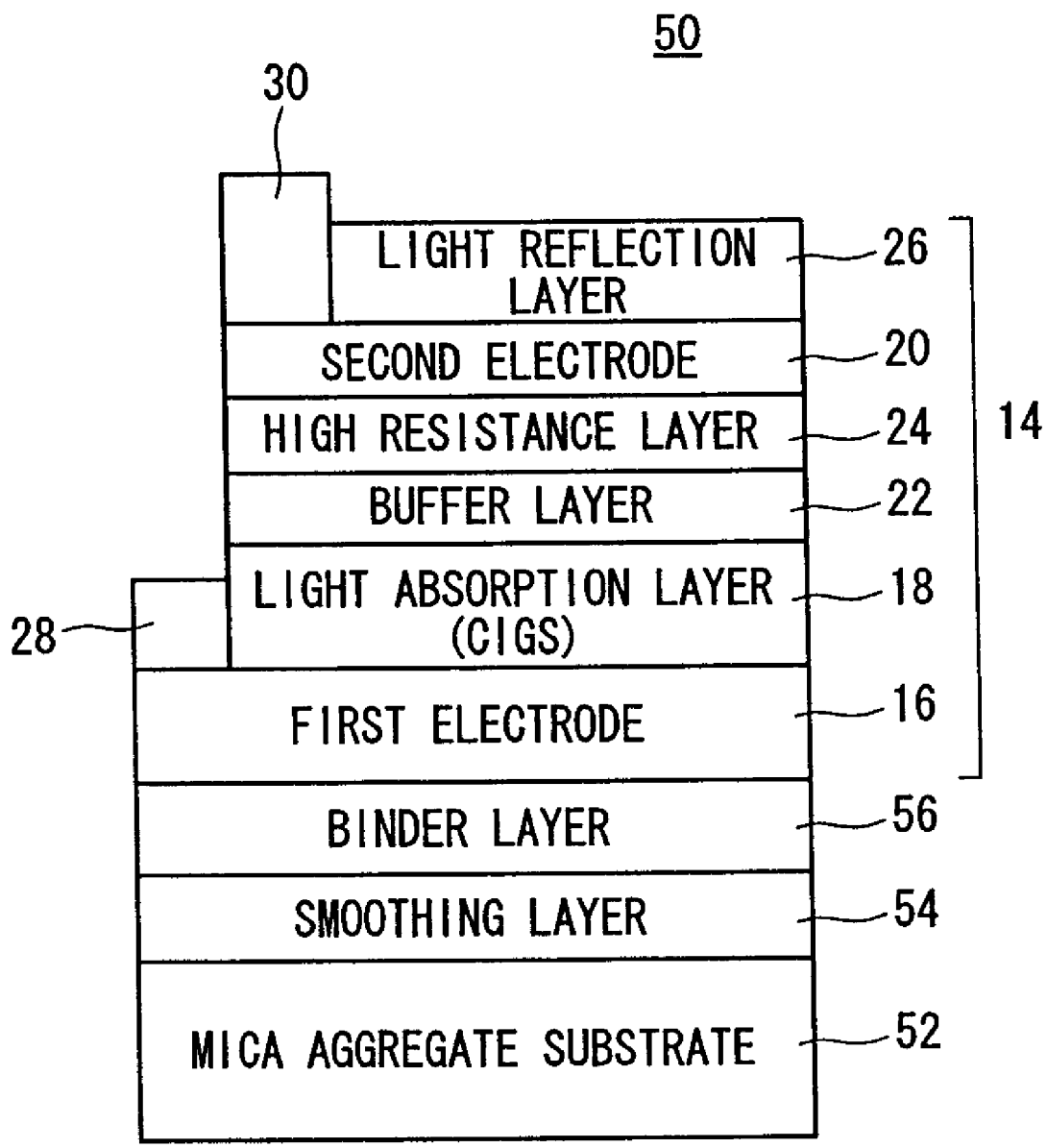
FIG. 1 is a schematic vertical sectional view illustrating a chalcopyrite type solar cell according to an embodiment of the present invention.

A chalcopyrite type solar cell according to the present invention shall be explained in detail below with reference to the accompanying drawings, which exemplify preferred embodiments of the invention. Constitutive components, which are the same as those shown in FIG. 5, shall be designated using the same reference numerals, and detailed explanation thereof shall be omitted.

FIG. 1 is a schematic vertical sectional view illustrating a chalcopyrite type solar cell 50 according to an embodiment of the present invention. The chalcopyrite type solar cell 50 comprises a substrate 52, a stack 14, together with a smoothing layer 54 and a binder layer 56, which are interposed between the substrate 52 and the stack 14.

In this embodiment, the substrate 52 is formed of a mica aggregate. The term "mica aggregate" as used herein refers to a material obtained by sintering, after mixing powdery granular mica with a resin.

The mica aggregate is an insulator possessing an extremely large resistance value ranging from $10^{12}$ to $10^{16} \Omega$. The mica aggregate further has properties such that the resistance and durability thereof is high, for example, with respect to acids, alkalis, and $H_2Se$ gas. Further, the mica aggregate is light in weight, and excellent in flexibility. In contrast to a heat resistance temperature of 500 to 550° C. of a glass substrate such as soda-lime glass, the mica aggregate exhibits a relatively high heat resistance temperature of 600 to 800° C.

Figure 2:
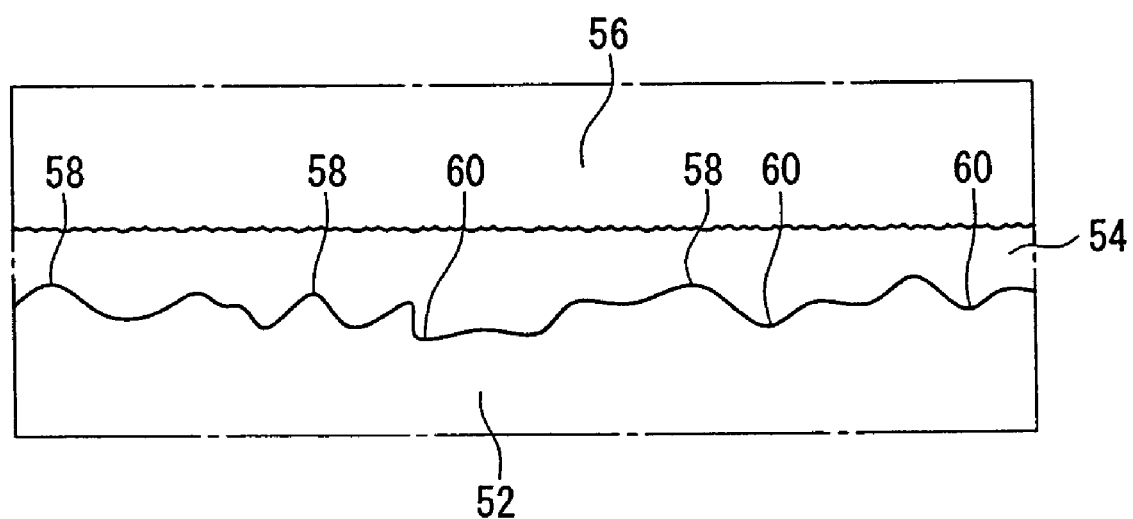
FIG. 2 is a magnified view illustrating major portions shown in FIG. 1.

As shown in the magnified view of FIG. 2, concave portions 58 and convex portions 60 are present on the upper end surface of the substrate 52, which is composed of the mica aggregate. Specifically, the upper end surface of the mica aggregate substrate 52 is extremely irregular.

When a first electrode 16 making up the stack 14 is stacked on the irregular mica aggregate substrate 52, such irregularities are also transferred to the upper end surface of the first electrode 16. If a light absorption layer 18 is provided on the first electrode 16 as described above, a tendency develops in that the open circuit voltage of the chalcopyrite type solar cell 50, when produced as a final product, is lowered.

Accordingly, in the embodiment of the present invention, a smoothing layer 54, having small irregularities therein as compared with the mica aggregate substrate 52, is allowed to intervene between the substrate 52 and the binder layer 56. When the smoothing layer 54, having smaller irregularities, intervenes in this manner, the irregularities that are transferred to upper end surfaces of the first electrode 16 and the light absorption layer 18 are decreased. Therefore, a decrease in the open circuit voltage of the chalcopyrite type solar cell 50 can be avoided.

For example, either SiN or $SiO_2$ is selected as the material for the smoothing layer 54. This arrangement is advantageous in order to facilitate film formation. Further, since the smoothing layer 54 satisfactorily joins with the mica aggregate substrate 52 and the binder layer 56, a high joining strength between the substrate and the stack can be obtained.

The binder layer 56, which is provided on the smoothing layer 54, is a layer that ensures strong joining of both the mica aggregate substrate 52 and the smoothing layer 54. The binder layer 56 also serves as a diffusion-preventive layer, for preventing any further diffusion of impurities, which are diffused from the mica aggregate substrate 52. More specifically, impurities contained in the mica aggregate substrate 52 are prevented from diffusing toward the light absorption layer 18 owing to the presence of the binder layer 56.

The preferred material for the binder layer 56 is TiN or TaN. Such a substance joins satisfactorily, for example, with SiN or $SiO_2$, which forms the material of the smoothing layer 54, as well as with Mo, which forms the material of the first electrode 16. Therefore, as a result of the smoothing layer 54, the stack 14 can be retained on the mica aggregate substrate 52 with a satisfactory joining strength.

It is preferable for the thickness of the binder layer 56 to be 0.5 to 1 µm. If the thickness is less than 0.5 µm, the binder layer 56 cannot function easily as a barrier. On the other hand, if the thickness exceeds 1 µm, the joining strength of the binder layer 56 cannot be ensured.

The stack 14 is formed by stacking the first electrode 16 composed of Mo, the light absorption layer 18 composed of CIGS, the buffer layer 22 composed of CdS, the high resistance layer 24 composed of ZnO, the transparent second electrode 20 composed of ZnO/Al, and the antireflection layer 26 composed of $MgF_2$, which are stacked in this order from the side of the binder layer 56. Portions of the first electrode 16 and the second electrode 20 remain exposed. A first lead section 28 and a second lead section 30 are provided, respectively, at the exposed portions.

The chalcopyrite type solar cell 50 according to the embodiment of the present invention, which is constructed as described above, is excellent in flexibility because the substrate 52 is composed of a mica aggregate, as described above. Accordingly, the mica aggregate can be wound in a rolled form, which can be fed. Therefore, a roll-to-roll method can be adopted in order to enable mass production, and hence, mass production of the chalcopyrite type solar cell 50 can be realized.

Further, the mica aggregate is both inexpensive and light in weight, as compared to soda-lime glass. Therefore, production costs of the chalcopyrite type solar cell 50 are inexpensive. Further, the mass of the chalcopyrite type solar cell 50 can be decreased.

As described above, the mica aggregate possesses highly excellent heat resistance, as compared with the glass substrate 12. Therefore, selenide formation can be conducted at about 600 to 700° C., using $H_2Se$ gas as a precursor of Cu, In, Ga, which are allowed to adhere to the first electrode 16, in order to provide the light absorption layer 18. Selenide formation of the precursor can be reliably advanced under the conditions described above. Therefore, the open circuit voltage in the chalcopyrite type solar cell 50, when produced as a final product, is extremely large, for the following reasons.

Specifically, it is postulated that when selenide formation is performed at 600 to 700° C. using a gas phase, the light absorption layer 18 is formed in which Ga is dispersed substantially uniformly in a crystalline state. Therefore, the band gap is expanded.

Further, according to the embodiment of the present invention, the binder layer 56 intervenes between the mica aggregate substrate 52 and the stack 14. Accordingly, the mica aggregate substrate 52 is reliably joined to the stack 14 with a sufficient joining strength. Therefore, disengagement of the stack 14 from the mica aggregate substrate 52 is prevented.

Impurities such as Al, K, Li, Na, Mg, and F are contained in the mica aggregate substrate 52. However, such impurities are prevented from being diffused toward the light absorption layer 18 owing to the presence of the binder layer 56. Therefore, a chalcopyrite type solar cell, which is quite excellent in energy conversion efficiency, can be obtained.

Further, in this arrangement, irregularities on the upper end surface of the mica aggregate substrate 52 are decreased so as to be as small as possible by means of the smoothing layer 54. Therefore, transfer of irregularities to the first electrode 16 and the light absorption layer 18 can be avoided. As a result, an advantage is obtained in that the open circuit voltage of the chalcopyrite type solar cell 50 is increased.

Figure 3:
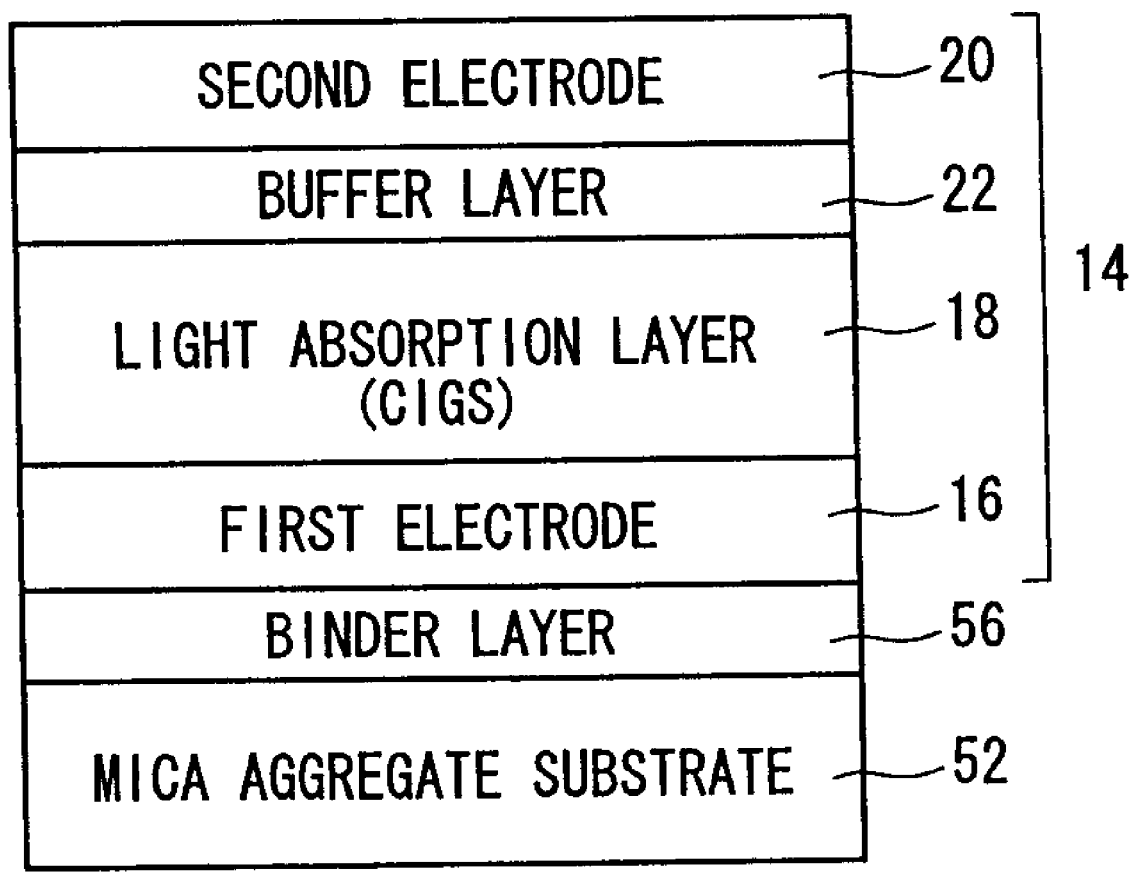
FIG. 3 is a schematic vertical sectional view illustrating a chalcopyrite type solar cell according to another embodiment.

In the embodiment of the present invention, the smoothing layer 54 is provided. However, as shown in FIG. 3, the binder layer 56 may also be provided directly on the mica aggregate substrate 52 without the smoothing layer 54, provided that the upper end surface of the mica aggregate substrate 52 is sufficiently smooth, i.e., to such an extent that energy conversion efficiency of the chalcopyrite type solar cell 50 is not lowered. TiN and TaN, which may be used as materials for the binder layer 56, are satisfactorily joined with the mica aggregate material of the substrate 52. Therefore, in this arrangement as well, it is possible to secure a sufficient joining strength between the substrate 52 and the stack 14. Also, in this case, it is preferable for the thickness of the binder layer 56 to be 0.5 to 1 μm.

TiN and TaN join with the mica aggregate substrate 52 at a joining strength that is larger than that of SiN or $SiO_2$, which forms the material of the smoothing layer 54. Therefore, in order to further secure the joining strength, as shown in FIG. 4, another binder layer 56 may also be provided between the mica aggregate substrate 52 and the smoothing layer 54.

Figure 4:
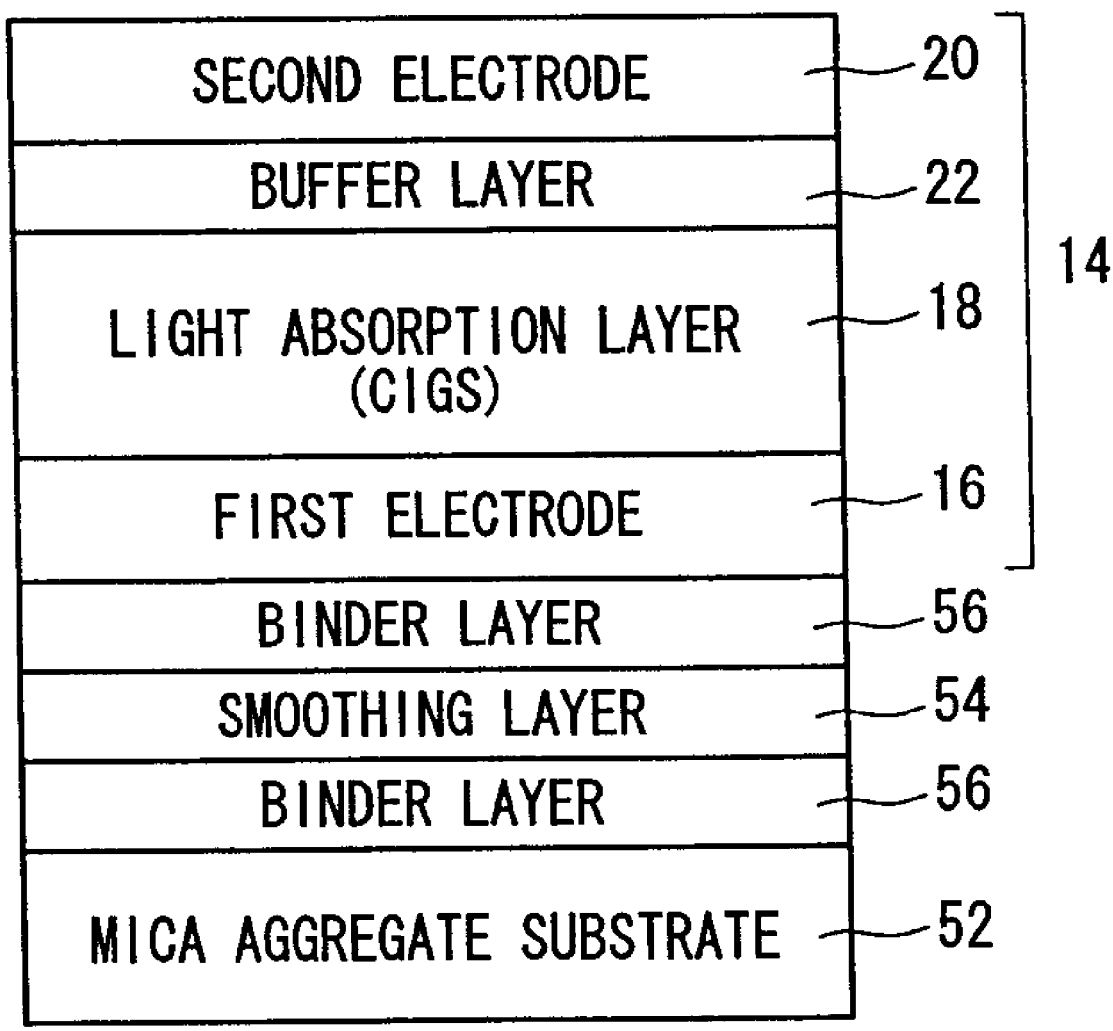
FIG. 4 is a schematic vertical sectional view illustrating a chalcopyrite type solar cell according to still another embodiment.

As clearly understood from FIGS. 3 and 4, the stack 14 may be constructed without providing the buffer layer 22, the high resistance layer 24, and the antireflection layer 26.

Further, the first electrode 16 may be composed of either titanium Ti or tungsten W.

The invention claimed is:

1. A chalcopyrite type solar cell comprising a stack including a first electrode composed of a metal, a light absorption layer formed on or above said first electrode, said light absorption layer being composed of a chalcopyrite type compound and serving as a P-type semiconductor, and a second electrode formed on or above said light absorption layer, said second electrode serving as an N-type semiconductor, wherein:

mica is contained in an insulative substrate that retains said stack;

a smoothing layer having irregularities on an upper end surface thereof is provided between said insulative substrate and said stack, said irregularities of the smoothing layer being smaller than irregularities on an upper end surface of said insulative substrate; and a binder layer and a diffusion-preventive layer are interposed between said insulative substrate and said stack such that said binder layer and said diffusion-preventive layer sandwich said smoothing layer, said diffusion-preventive layer being provided between said smoothing layer and said insulative substrate and preventing diffusion of impurities from said insulative substrate, each of said binder layer and said diffusion-preventive layer containing TiN or TaN, and each of said binder layer and said diffusion-preventive layer having a thickness of 0.5 to 1 μm.

2. The chalcopyrite type solar cell according to claim 1, wherein said insulative substrate comprises a mica aggregate, which is sintered after mixing said mica and a resin.

3. The chalcopyrite type solar cell according to claim 2, wherein said smoothing layer contains one of SiN and $SiO_2$.

4. The chalcopyrite type solar cell according to claim 1, wherein a buffer layer and a semi-insulative layer are interposed between said light absorption layer and said second electrode.

* * * * *